United States Patent
Ashley et al.

[11] Patent Number: 6,133,590
[45] Date of Patent: Oct. 17, 2000

[54] LOW RESISTANCE CONTACT SEMICONDUCTOR DIODE

[75] Inventors: Timothy Ashley; Graham J Pryce, both of Malvern, United Kingdom

[73] Assignee: The Secretary of State for Defence in Her Britannic Majesty's Government of the United Kingdom of Great Britain and Northern Irelands, Farnborough, United Kingdom

[21] Appl. No.: 09/068,943

[22] PCT Filed: Nov. 27, 1996

[86] PCT No.: PCT/GB96/02914

§ 371 Date: May 21, 1998

§ 102(e) Date: May 21, 1998

[87] PCT Pub. No.: WO97/20353

PCT Pub. Date: Jun. 5, 1997

[30] Foreign Application Priority Data

Nov. 29, 1995 [GB] United Kingdom .................. 9524414

[51] Int. Cl.[7] ...................... H01L 33/00; H01L 31/101; H01L 31/0296; H01L 31/0304; H01L 29/89

[52] U.S. Cl. ........................ 257/106; 257/94; 257/101; 257/103

[58] Field of Search ................ 257/94, 101, 103, 257/106

[56] References Cited

U.S. PATENT DOCUMENTS 5,166,761 11/1992 Olson ........................................ 257/94

5,338,944 8/1994 Edmond et al. ..

FOREIGN PATENT DOCUMENTS

| 0 287 458 | 10/1988 | European Pat. Off. .. |
| 0 709 939 | 5/1996 | European Pat. Off. .. |
| WO 92 12540 | 7/1992 | WIPO . |

OTHER PUBLICATIONS

Applied Physics Letters, vol. 62, No. 20, May 17, 1993, pp. 2510–2512, XP000303799 Sugg A R et al: "N–P–(P+–N+)–N ALYGA1–YAS–GAAS–INXGA1–XAS QUANTUM–WELL LASER WITH P+–N+GAAS–IN-GAAS TUNNEL CONTACT ON N–GAAS"see the whole document.

INSTITUTE OF PHYSICS CONFERENCE SERIES. INTERNATIONAL CONF MATERIALS FOR NON–LINEAR AND ELECTRO–OPTICS, No. 144, 1995, pp. 345–352, XP000607745 ASHLEY T: ELECTRONIC AND OPTOELECTRONIC DEVICES IN NARROW–GAP SEMICONDUCTORS: cited in the application see the whole document.

*Primary Examiner*—Jerome Jackson, Jr.
*Attorney, Agent, or Firm*—Nixon & Vanderhye P.C.

[57] ABSTRACT

A semiconductor device wherein the layer of highly doped p-type material typically found in devices of the prior art is replaced with a layer of doped n-type material, having a doping concentration of between $1 \times 10^{18}$ cm$^{-3}$ and less than $1 \times 10^{19}$ cm$^{-3}$, and a thin layer of doped p type material thus facilitating low resistance contact, transparency to radiation produced by the device and confinement with low loss of radiation produced by laser devices.

9 Claims, 5 Drawing Sheets

Fig. 3a *(Prior Art)*
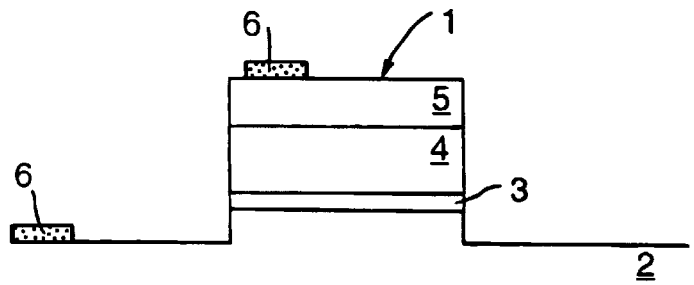
Fig. 3b
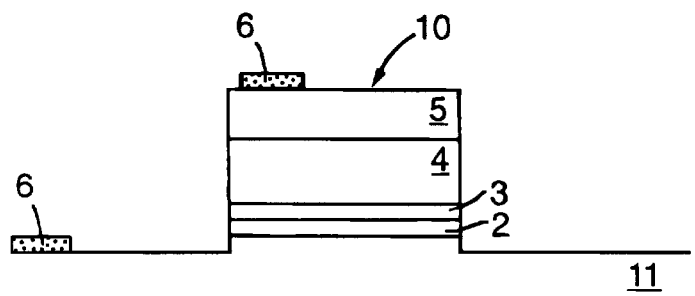
Fig. 4a *(Prior Art)*
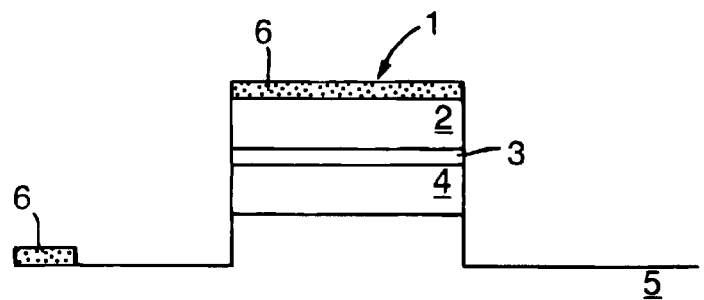

LOW RESISTANCE CONTACT SEMICONDUCTOR DIODE

BACKGROUND OF THE INVENTION

1. Field of the Invention

The current invention relates to devices made from narrow-gap (and more conventional) semiconductors for operation at infrared wavelengths.

2. Discussion of Prior Art

Many prior art devices include a diode junction, hence metal contacts need to be formed to a region of n-type and a region of p-type material. Ideally the metal contact should be ohmic and have a low resistance, i.e. very much less than that of the junction. The surfaces of the semiconductors tend to comprise a native oxide, which is normally insulating to some extent and must be removed or disrupted to permit contact to the semiconductor underneath. The nature of the band-bending which often occurs at the metal-semiconductor interface means that it is relatively easy to obtain the desired contact to n-type material, but it can be difficult to achieve an ohmic, low resistance contact to the p-type semiconductor.

Alloying using a metal with a small proportion of a like-type dopant can be used with some semiconductors. When annealed, this gives a heavily doped region to which the metal is more likely to form an ohmic contact, for example Au/Zn for a $p^+$ p contact to GaAs. This does not work well, however, with the narrow-gap semiconductors, such as indium antimonide (InSb) and cadmium mercury telluride (CMT) because of their low melting temperatures and the high diffusion rates of some of the dopants. Ion milling is often used for the narrow-gap materials to remove the surface oxide. This tends to result in near surface (typically tens of nanometers) damage which is heavily n-type in nature plus additional damage which can propagate significantly further into the material and degrade the junction properties. As a consequence the thickness of the contact regions in diodes made from the narrow-gap semiconductors needs to be greater than, or of the order of, $10^{-6}$ m.

In devices such as light emitting diodes and diode lasers where optical radiation passes through one or both contact regions, this thickness of material can lead to significant optical losses which will degrade the device performance, in some cases catastrophically.

Degenerate doping of the material, i.e. doping to a sufficiently high level that the Fermi energy lies within the appropriate band, leads to a Moss-Burstein shift whereby the absorption coefficient for radiation of energy just greater than the band-gap decreases so that it becomes transparent. Owing to the band structure of the narrow-gap semiconductors, however, it is extremely difficult to induce degenerate doping levels in p-type material, so that a sufficient Moss-Burstein shift is not observable. In contrast, it is comparatively easy to produce degenerate doping in n-type material and large Moss-Burstein shifts can be achieved. Hence the n-type contact regions of diodes can be made transparent to radiation generated or absorbed in the active region but the p-type contact region can not.

Also relevant to the present invention is U.S. Pat. No. 5,338,944. This document describes a light emitting diode for emitting visible radiation in the blue region of the visible spectrum, comprising an n-type silicon carbide substrate, an n-type silicon carbide top layer and a light emitting p-n junction structure between the n-type substrate and the n-type top layer. The device also includes, between the n-type top layer and the n-type substrate, means for coupling the n-type top layer to the light emitting p-n junction structure while preventing n-p-n behaviour between the n-type top layer, the p-type layer in the junction structure and the n-type substrate. This is achieved by means of a degenerate junction structure comprising a p-type portion and an n-type portion of silicone carbide. The p-type portion and the n-type portion are very thin, of the order of 250–1000 angstroms, with a very high doping concentration of at least $1 \times 10^{-19}$ cm$^{-3}$. This invention relates to light emitting diodes operating in the blue region of the visible wavelength spectrum. It therefore relates to devices formed from materials having a bandgap of at least 2.6 eV, such as silicon carbide.

Applied Physics Letts, 62(1993) 17 May, No. 20, New York, USA (A. R. Sugg et al.) relates to n-p-($p^+$-$n^+$)-n $Al_yGa_{1-y}As$-GaAs-$In_xGa_{1-x}As$ quantum-well laser with $p^+$-$n^+$ GaAs-InGaAs tunnel contact on n-GaAs. Hence, this document relates to laser devices formed on GaAs substrates.

SUMMARY OF THE INVENTION

According to the current invention, a semiconductor device comprises an active layer of p-type or n-type material forming a junction with a first layer of doped n-type material, a second layer of doped n-type material adjacent to a layer of doped p-type material, which may be adjacent to, or separated from by other layers, the active layer of p-type or n-type material, and means for providing electrical contact with the device including means for providing electrical contact, via the second layer of doped n-type material, with the adjacent layer of doped p-type material, characterized in that the second layer of doped n-type material has a doping concentration of between $1 \times 10^{18}$ cm$^{-3}$ and less than $1 \times 10^{19}$ cm$^{-3}$ and in that the semiconductor energy band-gap of the active layer is less than 0.5 eV.

The invention should not be regarded as being restricted to a particular set of doping levels.

Preferably one or both of the first and second layers of doped n-type material is transparent to radiation, of energy greater than that of the band-gap, which is emitted or absorbed by the device.

In a specific embodiment the device comprises a front surface emitting positive LED, negative LED or detector.

In another specific embodiment the device comprises a back surface emitting positive LED, negative LED or detector wherein the means for providing electrical contact, via the second layer of doped n-type material, with the adjacent layer of doped p-type material comprises a metallic contact and the second layer of doped n-type material provides a transparent front contact region to facilitate the use of the metallic contact as a mirror.

In another specific embodiment the device comprises a laser diode and the first and second layers of doped n-type material provide optical confinement within the active layer.

In another specific embodiment the second layer of doped n-type material provides and electrical path to an excluding or extracting contact. In this embodiment the device may comprise a field effect transistor or a bipolar transistor.

In another embodiment of the invention, the device may be a front surface emitting negative LED, wherein the doping concentration of the doped n-type layer extends beyond $1 \times 10^{19}$ cm$^{-3}$.

In another embodiment of the invention, the device may be a back surface emitting negative LED, wherein the doping concentration of the doped n-type layer extends beyond $1\times10^{19}$ cm$^{-3}$, and wherein the means for providing electrical contact, via the second layer of doped n-type material, with the adjacent layer of doped p-type material comprises a metallic contact, and the second layer of doped n-type material provides a transparent front contact region to facilitate the use of the metallic contact as a mirror.

BRIEF DESCRIPTION OF THE DRAWINGS

The invention will not be described, by way of example only, with reference to the following figures in which:

FIGS. 3a and 3b respectively show light emitting diodes of the prior art and the current invention;

FIGS. 4a and 4b respectively show back surface emitting devices of the prior art and the current invention;

DETAILED DISCUSSION OF PREFERRED EMBODIMENTS

Throughout this specification p and n indicate the type of doping in a material, the superscripts − and + indicate light and heavy doping respectively, the underline indicates material of high band gap, v denotes an active layer of near intrinsic n-type material and π denotes an active layer of near intrinsic p-type material. The term "highly doped" when applied to layers within devices of the current invention should be construed as a relative term; thus layers to which the term is applied are understood to be more highly doped that those to which it is not.

The invention is described in relation to light emitting diodes and lasers fabricated in the indium aluminium antimonide (In$_{1-x}$Al$_x$Sb) material system, but is not limited to this system. The generic concept is applicable to both types of device, and will be described first, but its detailed design criteria and implementation are slightly different for each case and these will be described subsequently.

EXAMPLE 1

Generic Concept

By the current invention the majority of the highly doped p-type contact region immediately adjacent to the contact in a diode of the prior art is replaced with highly doped, degenerate n-type material, leaving only a thin (of the order of $0.1\times10^{-6}$ m thick) highly doped (but not necessarily degenerate) p-type region adjacent to the remainder of the diode. The thickness of the remaining p$^+$ region is sufficiently small that it does not result in significant absorption of the optical radiation.

The electrical junction formed between these n$^+$ and p$^+$ regions will be biased in the opposite sense to the active decode so, for example, if the active diode was forward biased the 'contact' diode would be reverse based and might be expected to introduce a large series resistance. It is a property of narrow-gap semiconductors, however, that when heavily doped regions of opposite carrier type are in immediate proximity to each other, the probability of carrier tunnelling between the regions is very high even with reduced potential across the junction. Hence a very large tunnelling current can pass through the n$^+$p$^+$ diode and it does not present a significant series resistance. Therefore the requirement for transparent contact regions on both sides of the active region can be fulfilled and efficient device operation can be achieved.

Figure 1A:
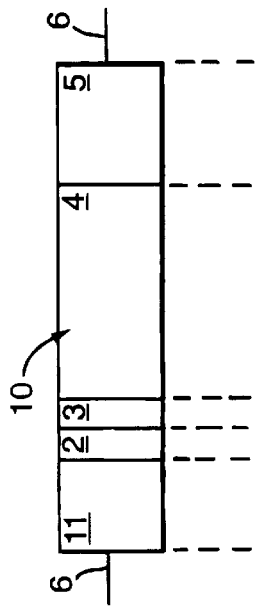
FIG. 1a and 1b respectively show generic devices of the prior art and of the invention.
Figure 2A:
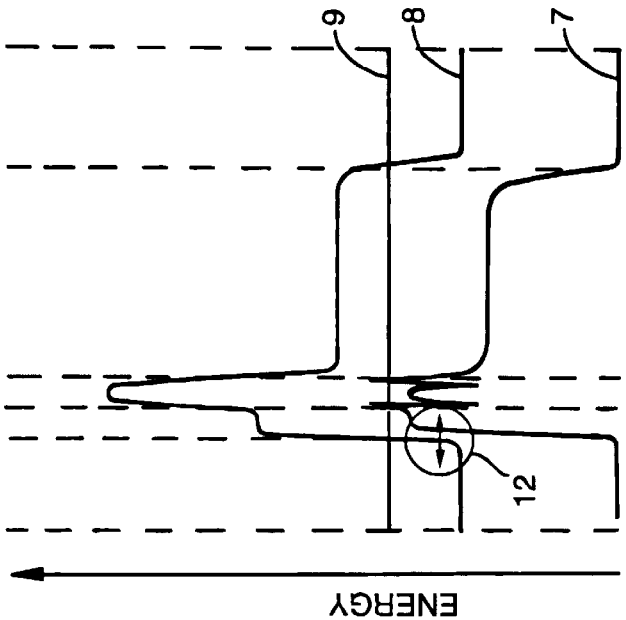
FIG. 2a and 2b respectively show the band diagrams, at zero bias, of the devices shown in FIGS. 1a and 1b.

Referring to FIG. 1a, a typical 4-layer structure 1, of the prior art comprises a layer of p$^+$ material 2, a layer of p$^+$ material 3 such as In$_{1-x}$Al$_x$Sb, an active layer of π-type material 4 and a layer of n$^+$ material 5. Electrical contacts 6 are made with layers 2 and 5. FIG. 2a qualitatively shows the relative energies of the valence band 7, conduction band 8 and Fermi level 9 of the device shown in FIG. 1a.

The design criteria and operation of this structure in the context of LEDs, detectors and transistors has been published previously (see T. Ashley, C. T. Elliott, N. T. Gordon, R. S. Hall. A. D. Johnson And G. J. Pryce, 'Uncooled InSb/In$_{1-x}$Al$_x$Sb mid-infrared emitter', *App. Phys. Lett.* 64 2433 (1994); T. Ashley, A. B. Dean, C. T. Elliott, G. J. Pryce, A. D. Johnson and H. Willis. 'Uncooled high-speed InSb field-effect transistors', *Appl. Phys. Lett.* 66 481 (1995) and T. Ashley, 'Electronic and optoelectronic devices in narrow-gap semiconductors', *Proc. 7th Int. conf. Narrow-Gap Semiconductors*, Santa Fe, N.M., USA Jan. 9–12, 1995.

Figure 1B:
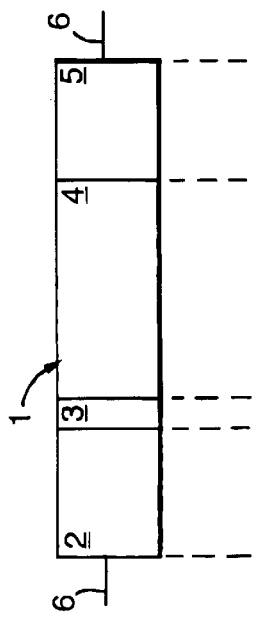
Figure 2B:
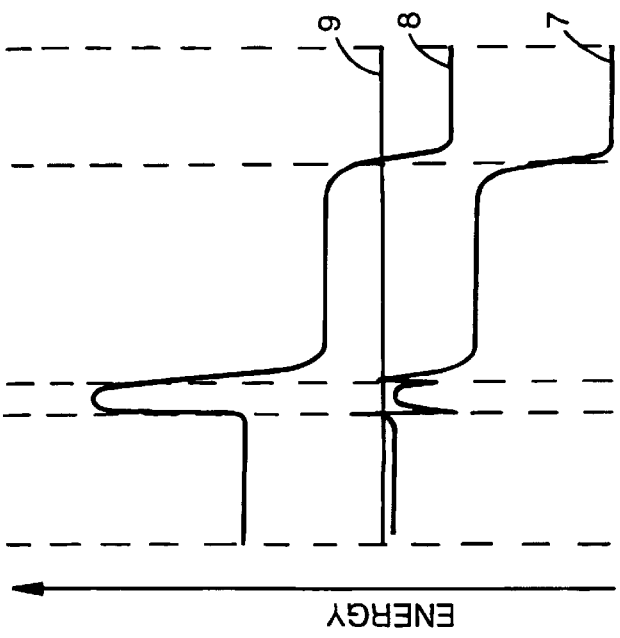

A device of the current invention 10 (comprising a modified, tunnel contact 5-layer structure) and its band diagram are shown in FIGS. 1b and 2b respectively. In all the figures of this specification, corresponding items performing a similar role are labelled with the same numeral.

In addition to the first layer of n$^+$ material 5, performing a role similar to that of layer 5 in FIG. 1a, device 10 has a second layer of n$^+$ material 11 through which electrical contact with p$^+$ layer 2 is made. The thickness of p$^+$ layer 2 is greatly reduced in comparison with that of layer 2 in device 1.

The region of the semiconductor where tunnelling occurs is shown schematically by region 12 in FIG. 2b. In the case of the device shown, the active region is π-type but this is not essential to the invention and it could have a different doping type and level (for example v type) in other devices, and could even be a multiplicity of layers.

Table 1 lists typical thicknesses for the layers of devices 1 and 10, but the invention is not generally limited to these values.

TABLE 1

Layer thicknesses for devices 1 and 10 shown in FIGS. 1a and 2a respectively.

| | Thickness (m × 10$^{-6}$) | |
|---|---|---|
| Layer | Device 1 | Device 10 |
| 11 | — | 0.9 |
| 2 | 1 | 0.1 |
| 3 | 0.02 | 0.02 |
| 4 | 3 | 3 |
| 5 | 1 | 1 |

Calculation of the tunnelling probability indicates that in InSb at room temperature 294 K) with a doping of $1\times10^{18}$ cm$^{-3}$ on each side of the n$^+$/p$^+$ junction that the maximum of the product of area and resistance in reverse bias should be less than $10^{-3}$ Ω cm$^2$. This is about half the value for a comparable device of the prior art.

The tunnel junction effectively forms a large recombination velocity contact to the p$^+$ region, which could potentially inject additional electrons over the In$_{1-x}$Al$_x$Sb barrier (layer 3) in to the active diode and degrade its performance. Modelling indicates that for a diode at 294 K with a barrier of composition x=0.15 and a p$^+$ doping of 3×10$^{18}$ cm$^{-3}$, the p$^+$ thickness can be reduced to 0.01×10$^{-6}$m without decreasing the active diode R$_o$A (produce of resistance at zero bias and area) by more than 1%. The value of 0.01×10$^{-6}$ m represents a lower figure for the accuracy of the model rather than a predicted minimum thickness.

The maximum thickness of the p$^+$ region 2 is determined by the acceptable optical loss or electrical series resistance, as discussed below for the specific devices. If a thickness of more than 10$^{-6}$ m is acceptable, it is not necessary to use the n$^+$ tunnel contact simply to avoid damage to the active diode as the p$^+$ region alone will suffice to absorb any contacting damage. However the n$^+$ region 11 also has the benefit of a very much lower (approx. factor of 50 per unit thickness) resistance, which can be very important if the lateral resistance of a contact region is significant.

EXAMPLE 2

Light Emitting Diodes

Included within this group of devices are positive luminescence diodes, negative luminescence diodes detectors and vertical cavity surface emitting lasers. In all of these devices, light is transmitted essentially vertically through one of the contact regions of the diode.

1. Front surface devices:

Referring to FIG. 3a, a diode 1 of the prior art where the radiation, absorbed or emitted in active region 4, is to be transmitted through the front or top surface, would normally have an n$^+$ top contact region 5, doped sufficiently highly that it is transparent, and the p$^+$ contact region 2 would be at the bottom of the structure adjacent to the substrate not shown. This can lead to a large lateral resistance (R$_p$) along the p-type material 2 which is comparable to the diode R$^o$. This would lead to extra power dissipation in LEDs and would degrade the signal to noise performance of a detector. Referring to FIG. 3b, the use of a parallel n$^+$ region 11 with resistance R$_n$ and a tunnel junction with resistance R$_t$ such that R$_n$+R$_t$<<R$_p$ would reduce the series resistance and so reduce power dissipation in the LEDs and improve signal to noise ratio in the detectors.

Back surface devices.

Figure 4B:
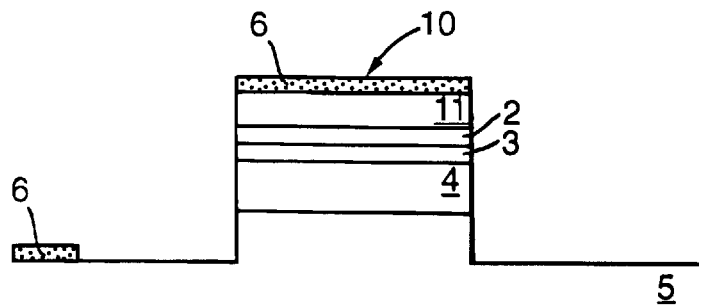

Referring to FIG. 4a, radiation, absorbed or emitted in active region 4, is intended to be transmitted through the substrate of prior art device 1 and the back surface would normally be designed with the p$^+$ region 2 uppermost, so that the light passes through a transparent n$^+$ region 5 and a transparent n$^+$ substrate (not shown). In this case the top metal contact 6 can be placed over the whole of the upper surface to form a mirror to reflect light back through the active region 4. A single thick p$^+$ layer 2 attenuates this reflected light, negating the benefit of the mirror. Referring to FIG. 4b the use of an n$^+$ region 11 to form a tunnelling junction to thin p$^+$ material 2 enables it to be transparent so that a higher proportion of the light is reflected.

EXAMPLE 3

Lasers

Figure 5A:
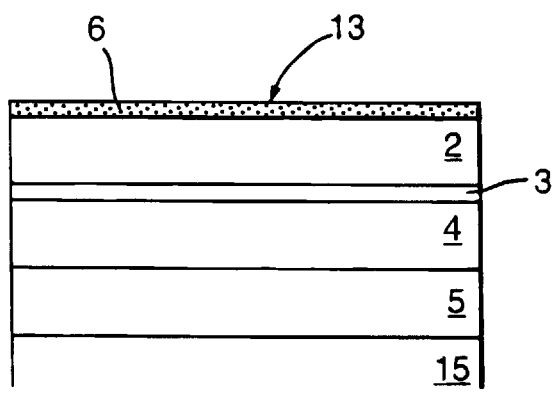
FIGS. 5a and 5b respectively show semiconductor laser devices of the prior art and the current invention.

Referring to FIG. 5a, a typical semiconductor laser 13 requires an active gain region 4 surrounded by cladding layers 2,5 which provide electrical confinement of the carriers and optical confinement and guiding of the emission. The prior art structure described above in the context of LEDs and detectors provides excellent electrical confinement, however it does not give good enough optical confinement. Optical confinement is obtained through a change (decrease) in refractive index at the interfaces with the cladding regions which guides the radiation back into the active region. A reduction in the refractive index can be achieved in the InSb material system through high doping, however only highly doped n-type layer 5 also becomes transparent to radiation just above the band-gap; the highly doped p-type layer 2 remains absorbing. Hence, even though some guiding is achieved by the p$^+$ cladding layer 2 it strongly attenuates a wave propagating down the laser leading to the requirement for a very much higher gain in the material before stimulated emission is obtained—effectively preventing the laser from operating.

Figure 5B:
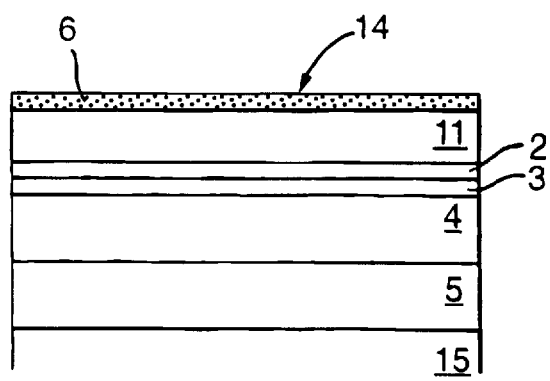

Referring to FIG. 5b, a laser device 14 of the current invention includes an n$^+$ layer 11 which forms a tunnel junction with p$^+$ layer 2 and permits guiding with low modal loss to be obtained on both sides of the active gain region 4 thus enabling the laser to operate.

Devices 13 and 14 would typically be fabricated on an n$^+$ substrate 15.

Table 2 lists typical thicknesses for the layers of devices 13 and 14, but the invention is not generally limited to these values.

TABLE 2

Layer thicknesses for devices 13 and 14 shown in FIGS. 5a and 5b respectively.

| Layer | Thickness (m × 10$^{-6}$) | |
|---|---|---|
| | Device 13 | Device 14 |
| 11 | — | 1 |
| 2 | 1 | 0.1 |
| 3 | 0.02 | 0.02 |
| 4 | 3 | 3 |
| 5 | 3 | 3 |

In order to produce an actual embodiment of the laser described generically in FIG. 5b layer structures as shown in therein were grown on highly doped n-type InSb substrates 15 doped within the range 10$^{18}$ cm$^{-3}$ to 3×10$^{18}$ cm$^{-3}$. The layer thicknesses were as indicated in table 2.

Figure 6A:
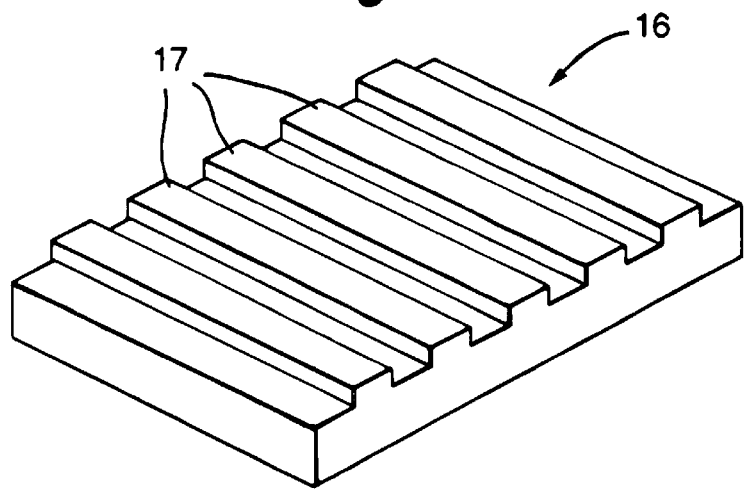
FIGS. 6a–6c show various stages of construction of a semiconductor laser device according to the current invention and FIG. 7 shows the performance of the device of FIG. 6c.

Referring to FIG. 6a, the substrates were generally circular with a diameter of 1.5 or 2 inch, and were sawn or cleaved into chips 16 of approximately 6 mm square after growth. The thickness of the chips was reduced, by polishing from the substrate side, from an initial thickness of 5×10$^{-4}$ m to 1.5–2×10$^{-4}$ m.

Figure 6B:
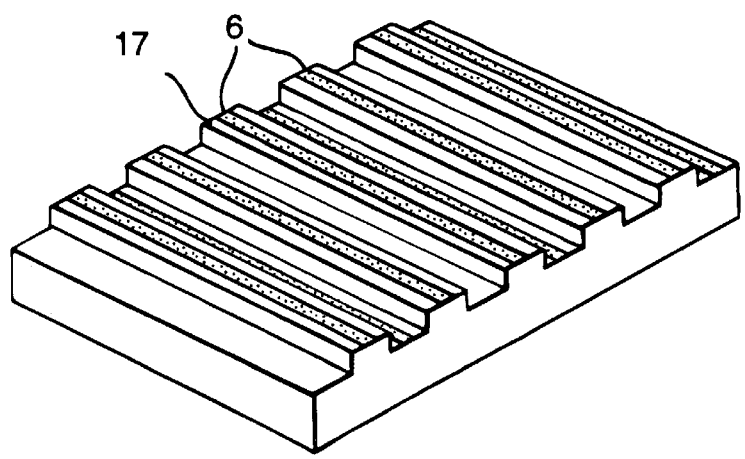

Conventional photolithographic means were used to etch down to the lower epitaxial n$^+$ layer (item 5 of FIG. 5b) to form mesa structures 17 of width 50×10$^{-6}$ m or 100×10$^{-6}$ m on a pitch of approximately 1 mm across the chip. Referring to FIG. 6b, similar photolithographic means were used to deposit chrominum/gold metallic contacts 6 on to the top each mesa 17 and, in some cases, to the common lower n$^+$ layer (item 5 of FIG. 5b).

Figure 6C:
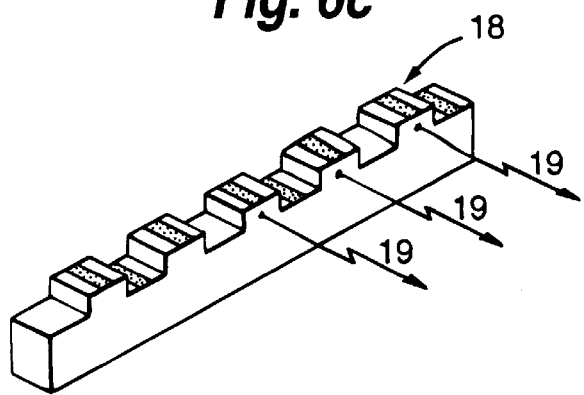

Each chip was then further cleaved, in a direction perpendicular to the mesa length, into pieces approximately 5×10$^{-4}$ m wide to form bars 18 each forming individual lasers which emitted radiation via the facets on the long sides of the bars as represented by arrows 19 in FIG. 6c.

Each bar was mounted separately on a standard sample package and gold wire bonds were applied to the top contact of each laser and to the common contact for subsequent assessment and use.

Figure 7:
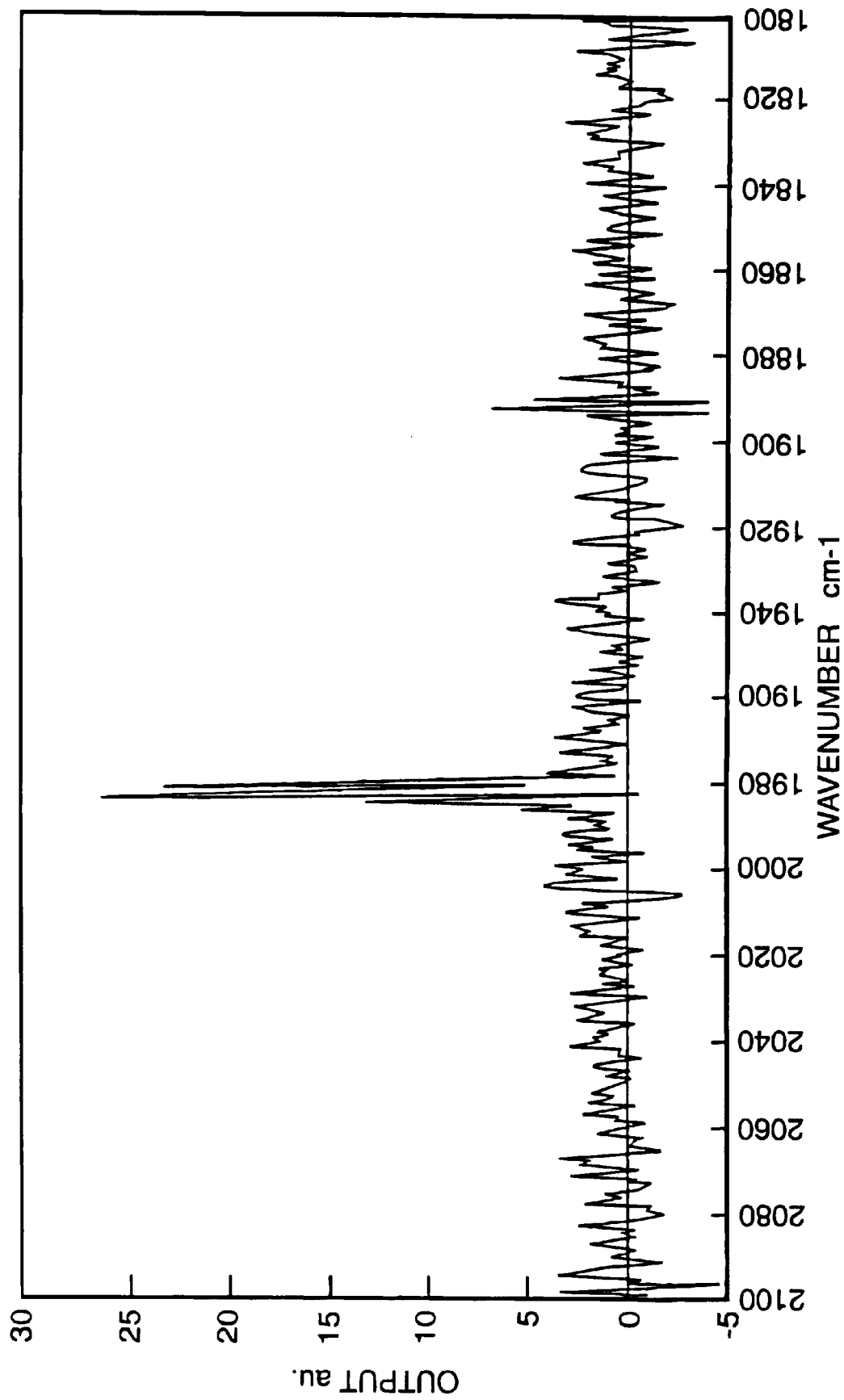

Modelling indicates that for the structure 14 shown in FIG. 5b, with the dimensions indicated in table 2, the absorption coefficient along the laser is only −0.0037/m× $10^{-6}$, compared with −0.06/m×$10^{-6}$ in the structure 13 of FIG. 5a. Fabrication of this structure has allowed the first demonstration of an electrically pumped laser in InSb at a temperature of 77 K, see the output spectrum in FIG. 7. Previously, devices required cooling to substantially lower temperatures and/or the use of high magnetic fields.

EXAMPLE 4

Transistors

The use of exclusion/extraction to enable room temperature operation of InSb based transistors has been patented (GB 2 266 183). Several types of these transistors, in particular the field effect devices, require the use of a $p^+$ region to form an excluding contact, which carries a significant current in a lateral direction. The use of an $n^+$ tunnel junction would reduce the voltage loss along this region in a similar manner to that described for the front surface LEDs.

For the purpose of this specification, in the context of optical devices (e.g. light receiving or light emitting devices) the phrase "action region" or "active layer" shall be taken to mean that region of the device in which substantial regeneration or recombination of carriers occurs. In a the context of electrical devices (e.g. transistors) the phrase "active region" or "active layer" shall be taken to refer to the region contacted by the excluding or extracting junction, in which the exclusion or extraction occurs i.e. the region in which there is a significant change in carrier concentration.

What is claimed is:

1. A semiconductor device comprising an active layer (4) of p-type or n-type material forming a junction with a first layer of doped n-type material (5), a second layer of doped n-type material (11) adjacent to a layer of doped p-type material (2), which may be adjacent to, or separated from by other layers, the active layer (4) of p-type or n-type material, and means for providing electrical contact with the device including means for providing electrical contact, via the second layer of doped n-type mater (11), with the adjacent layer of doped p-type material (2), wherein the second layer of doped n-type material (11) has a doping concentration of between $1\times10^{18}$ cm$^{-3}$ and less than $1\times10^{19}$ cm$^{-3}$ and in that the semiconductor energy band-gap of the active layer (4) is less than 0.5 eV and is transparent to radiation, of energy greater than that of the band-gap, which is emitted or absorbed by the device.

2. The device of claim 1 wherein said device comprises a front surface emitting positive LED, negative LED or detector.

3. The device of claim 1 wherein said device comprises a back surface emitting positive LED, negative LED or detector wherein the means for providing electrical contact, via the second layer of doped n-type material (11), with the adjacent layer of doped p-type material (2) comprises a metallic contact (6), and the second layer of doped n-type material (11) provides a transparent front contact region to facilitate the use of the metallic contact (6) as a mirror.

4. The device of claim 1 wherein said device comprises a laser diode (14) and the first and second layers of doped n-type material (11) provide optical confinement within the active layer (4).

5. The device of claim 1, wherein the second layer of doped n-type material (11) provides an electrical path to an excluding or extracting contact (6).

6. The device of claim 5 wherein said device comprises a field effect transistor.

7. The device of claim 5 wherein said device comprises a bipolar transistor.

8. A front surface emitting negative LED device, comprising an active layer (4) of p-type or n-type material forming a junction with a first layer of doped n-type material (5), a second layer of doped n-type material (11) adjacent to a layer of doped p-type material (2), which may be adjacent to, or separated from by other layers, the active layer (4) of p-type or n-type material, and means for providing electrical contact with the device including means for providing electrical contact, via the second layer of doped n-type material (11), with the adjacent layer of doped p-type material (2), wherein the second layer of doped n-type material (11) has a doping concentration of greater than $1\times10^{19}$ cm$^{-3}$ and in that the semiconductor energy band-gap of the active layer (4) is less than 0.5 eV and is transparent to radiation, of energy greater than that of the band-gap, which is emitted or absorbed by the device.

9. A back surface emitting negative LED device, comprising an active layer (4) of p-type or n-type material forming a junction with a first layer of doped n-type material (5), a second layer of doped n-type material (11) adjacent to a layer of doped p-type material (2), which may be adjacent to, or separated from by other layers, the active layer (4) of p-type or n-type material, and means for providing electrical contact with the device including means for providing electrical contact, via the second layer of doped n-type material (11), with the adjacent layer of doped p-type material (2), wherein the second layer of doped n-type material (11) has a doping concentration of greater than $1\times10^{19}$ cm$^{-3}$ and in that the semiconductor energy band-gap of the active layer (4) is less than 0.5 eV and is transparent to radiation, of energy greater than that of the band-gap, which is emitted or absorbed by the device, wherein the means for providing electrical contact, via the second layer of doped n-type material (11), with the adjacent layer of doped p-type material (2) comprises a metallic contact (6), and the second layer of doped n-type material (11) provides a transparent front contact region to facilitate the use of the metallic contact (6) as a mirror.

* * * * *